(12) United States Patent
Choi

(10) Patent No.: US 7,223,642 B2
(45) Date of Patent: May 29, 2007

(54) METHOD FOR FABRICATING LIQUID CRYSTAL DISPLAY DEVICE

(75) Inventor: Soon-Ho Choi, Gyungsangbuk-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 260 days.

(21) Appl. No.: 10/947,335

(22) Filed: Sep. 23, 2004

(65) Prior Publication Data

US 2005/0095754 A1 May 5, 2005

(30) Foreign Application Priority Data

Nov. 4, 2003 (KR) .................. 10-2003-0077624

(51) Int. Cl.
*H01L 21/00* (2006.01)
(52) U.S. Cl. ................................ 438/151; 438/149
(58) Field of Classification Search ............... 438/149, 438/151
See application file for complete search history.

(56) References Cited

U.S. PATENT DOCUMENTS

| 6,590,624 B1* | 7/2003 | Lee .............................. 349/54 |
| 2003/0178650 A1* | 9/2003 | Sonoda et al. .............. 257/204 |
| 2006/0011920 A1* | 1/2006 | Kim ............................ 257/72 |

* cited by examiner

*Primary Examiner*—Long Pham
(74) *Attorney, Agent, or Firm*—McKenna Long & Aldridge LLP

(57) ABSTRACT

A method for fabricating a TFT array substrate for a liquid crystal display device is provided. The method includes: preparing a substrate; forming a gate line on the substrate using a first etchant; forming an insulation layer on the gate line; forming a semiconductor layer on a portion of the insulation layer; forming a test line on the insulation layer and source and drain electrodes on the semiconductor layer; forming a passivation layer having passivation hole to expose a portion of the gate line on the substrate; and forming a pixel electrode on the passivation layer by applying a second etchant including $HNO_3$, a ferric compound, $HClO_4$ and flouro compound.

23 Claims, 8 Drawing Sheets

METHOD FOR FABRICATING LIQUID CRYSTAL DISPLAY DEVICE

The present invention claims the benefit of Korean Patent Application No. 2003-77624 filed in Korea on Nov. 4, 2003, which is hereby incorporated by reference.

BACKROUND OF THE INVENTION

1. Field of the Invention

The present invention relates to an etchant used for fabricating a liquid crystal display device and a liquid crystal display device fabricating method using the etchant, and more particularly, to an etchant used for forming a gate line and a method for forming a gate line and a pixel electrode using the etchant.

2. Description of the Related Art

A liquid crystal display panel is one of the main image display device these days. Especially, a TFT (Thin Layer Transistor) liquid crystal display device, which uses a TFT as a switching device for driving unit pixels, is widely used. The TFT liquid crystal display device includes a TFT array substrate on which TFTs, as switching devices, arranged in a matrix, a color filer substrate having a color filter formed corresponding the TFT array substrate, and liquid crystal disposed between the TFT array substrate and the color filter substrate.

The TFT array substrate of the liquid crystal display device is where unit pixels are driven by the TFTs. As a result, a process of forming the TFT array substrate is a particular important process among the processes for forming the TFT liquid crystal display device. In general, the processes of forming the TFT array substrate includes forming a gate electrode; forming a gate insulation layer on the gate electrode; forming a semiconductor layer on the gate insulation layer; forming a source/drain electrode and a data line on the semiconductor layer; forming a passivation layer on the data line; and forming a pixel electrode on the passivation layer. The process for forming the gate line includes depositing a gate metal on a transparent substrate and forming a gate line and a gate electrode pattern by applying a photolithography.

Formation of a gate line will be described in detail with reference to FIGS. 1A through 1D as follows.

First, as shown in FIG. 1A, a gate 2, such as molybdenum or aluminum alloy is deposed on a substrate 1 by a sputtering method. A gate with a single metal layer, such as a copper alloy or an aluminum alloy is typically used. However, a dual layer of an aluminum alloy which has excellent electric conductivity and high ohmic contact characteristics with a pad portion supplying a gate signal, and molybdenum is also commonly used. After the gate is formed on the substrate, it is patterned to form gate lines and gate electrodes.

As shown in FIG. 1B, a photoresist layer 3 is coated at the entire surface of the substrate with the gate deposited thereon by a spin coating method, and then, exposed by applying a gate line pattern-formed mask 4.

As shown in FIG. 1C, after the photoresist layer 3 is exposed, a developing process is performed to selectively remove the exposed photoresist layer. After the developing process is finished, a photoresist pattern 5 having the gate line pattern remains on the substrate, and an etching process is performed by applying the photoresist pattern 5 as a mask.

As shown in FIG. 1D, a gate line 6 is formed through the etching process. Methods for etching the gate 2 include a wet etching and a dry etching. The wet etching oxidizes the gate metal in a chemical solution to remove it, and the dry etching is irradiates ions in a plasma state on the gate metal to remove the gate. The wet etching has isotropic characteristics in that an etching rate is uniform according to an etching direction and the dry etching has anisotropic characteristics in that an etching rate is different according to an etching direction.

Because thin layers are formed on the gate line, the gate line needs to be formed in a tapered shape in order not to cut into the thin layers. Thus, to make the gate line have the tapered shape, a wet etching exhibiting isotropic etching characteristics is used to etch the gate line. Through the wet etching, the gate line can be formed in a tapered shape. In the related art, a dual layer of an aluminum alloy and molybdenum is used as the gate, and a mixed solution of $H_3PO_4$, $HNO_3$ and $CH_3COOH$ is used as an etchant. However, a problem exists in that the etching rates of the aluminum alloy layer and the molybdenum layer are different, thereby causing the tapered shape to be deformed.

FIGS. 2A and 2B show a related art method in which a dual layer of aluminum alloy layer and a molybdenum layer is used as the gate and the gate line is used by using a mixed solution of phosphoric acid ($H_3PO_4$), nitric acid ($HNO_3$) and acetic acid ($CH_3COOH$) as an etchant.

FIG. 2A illustrates the aluminum alloy layer 21 and the molybdenum layer 22 etched by the etchant in an abnormal form due to different etching rate. It is known that phosphoric acid of the etchant and the aluminum alloy layer 21 are reacted to etch the aluminum alloy layer 21, and nitric acid of the etchant is reacted with the molybdenum layer 22 to etch the molybdenum layer. In this respect, because the reactivity between the aluminum alloy layer 21 and phosphoric acid is greater than that between the molybdenum layer 22 and nitric acid, the patterned molybdenum layer 22 at the upper side of the aluminum alloy layer 21 is larger than the etched aluminum alloy layer 21 after etching is performed as shown in FIG. 2A. Thus, to make a perfectly tapered form, the wet etched-molybdenum layer 22 needs to be etched one more time by dry etching. Then, the molybdenum layer 22 has a corresponding tapered form with respect to the aluminum alloy layer 21.

FIG. 2B illustrates the stacked molybdenum layer 22 and aluminum alloy layer 21 tapered through the dry etching. After the etching process is finished, the photoresist remaining on the substrate 1 is removed and washed to form gate lines.

In summary, the gate line forming process can be divided into steps of depositing the gate metal on the substrate, forming the photoresist layer pattern through the exposing process, performing a wet-etching by applying the photoresist layer pattern as a mask, additionally dry-etching the wet etched-gate metal, and removing the photoresist layer and performing a cleaning. After the TFT is formed, a process of forming pixel electrodes serving to apply electric field to liquid crystal is performed. As the pixel electrode, transparent electrodes made of amorphous ITO (Indium Tin Oxide) is typically used. The pixel electrode made of the ITO layer is known to be wet etched by oxalic acid $(COOH)_2$.

In the process of fabricating the TFT array substrate, to prevent static electricity at the gate lines or data lines during fabrication of the array substrate, the ends of the gate lines and the data lines are connected to each other by shorting bar to make them an equipotential structure. By removing a shorting bar portion formed at the end of the gate line or the data line in the step of forming the pixel electrode, a TFT array substrate including the separated gate line and the data line is formed. The shorting bar portion can be removed through etching using the same etchant used in forming the gate line or by grinding (a physical method). Removal of the shorting bar portion using the etchant used for etching the gate can be possible because the shorting bar portion, which is also formed when the gate line is formed, has the same component as that of the gate line. Removal of the shorting bar portion by grinding generates many particles, thereby causing defects. As a result, the method of removing the shorting bar portion by etching is favored.

Removal of the shorting bar portion using the etchant used for forming the gate line is performed through two stages of the pixel electrode forming step and the shorting bar portion removing step. In the step of forming the pixel electrode, the pixel electrode is patterned by applying oxalic acid, and in the step of removing the shorting bar portion, the shorting bar portion is removed using the etchant used for patterning the gate line.

In the process of fabricating the TFT array using the dual layer of an aluminum alloy layer and an molybdenum layer, if the typical etch is used, wet etching is performed and then dry etching is to be performed additionally, thereby causing a process delay. In addition, since equipment for the dry etching is required, expenses are increased. Moreover, as for the pattern of the gate line using the typical etchant, since the side tilt angle of the tapered form is so large that cutting is caused in forming a thin layer on the gate line.

FIG. 3 is a photograph taken by electron microscope showing a gate line etched by using the conventional etchant. As shown, a profile of the gate line has a sharp tilt. In addition, in the step of forming the pixel electrode, since the oxalic acid $(COOH)_2$ is used for patterning the pixel electrode and an etchant is additionally used to etch the shorting bar portion, which performs dual process, makes the process complicated. Moreover, when the amorphous ITO layer, namely, the pixel electrode material, and the oxalic acid $(COOH)_2$ are reacted, crystal, namely, reaction remnants, precipitate on the equipment where the etching proceeds, thereby causing a problem in that an operator must periodically remove an icicle of crystal precipitate.

SUMMARY OF THE INVENTION

Accordingly, the present invention is directed to a method for fabricating liquid crystal display device that substantially obviates one or more of the problems due to limitations and disadvantages of the related art.

An object of the present invention is to provide an etchant that forms a gate line by a single wet etching in a step of forming a gate line using a dual layer of an aluminum alloy layer and a molybdenum layer.

Another object of the present invention is to provide a pixel electrode made of an amorphous ITO layer by applying the etchant.

Another object of the present invention is to provide a simple process for forming a liquid crystal display device by simultaneously removing a shorting bar portion formed to prevent static electricity of the gate line in the process of forming the amorphous ITO.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a method for fabricating a TFT array substrate for a liquid crystal display device includes preparing a substrate; forming a gate line on the substrate using a first etchant; forming an insulation layer on the gate line; forming a semiconductor layer on a portion of the insulation layer; forming a test line on the insulation layer and source and drain electrodes on the semiconductor layer; forming a passivation layer having passivation hole to expose a portion of the gate line on the substrate; and forming a pixel electrode on the passivation layer by applying a second etchant including $HNO_3$, a ferric compound, $HClO_4$ and flouro compound.

In another aspect, a method for fabricating a TFT array substrate for a liquid crystal display device includes: preparing a substrate; forming a gate line and a shorting bar on the substrate; forming an insulation layer on the gate line; forming a semiconductor layer on a portion of the insulation layer; forming a test line on the insulation layer and source and drain electrodes on the semiconductor layer; forming a passivation layer having passivation hole to expose a portion of the gate line on the substrate; and patterning a pixel electrode on the passivation layer and removing the gate line at the lower portion of the passivation hole, thereby separating the shorting bar and at least a portion of the gate line by applying an etchant including $HNO_3$, a ferric compound, $HClO_4$ and flouro compound.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1A:
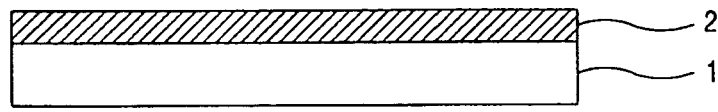
FIGS. 1A through 1D show sequential process of forming a gate line of a liquid crystal display device in accordance with the related art.
Figure 1B:
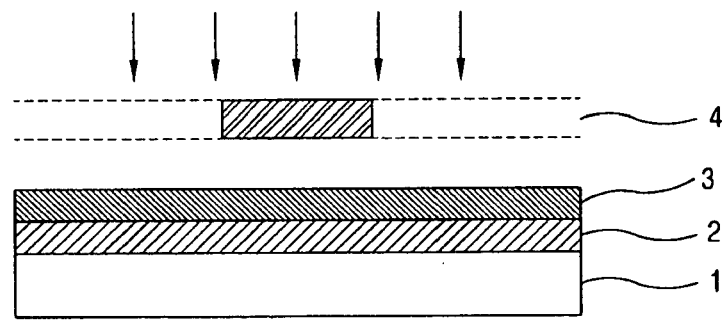
Figure 1C:
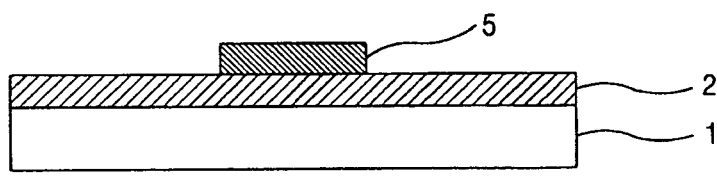
Figure 1D:
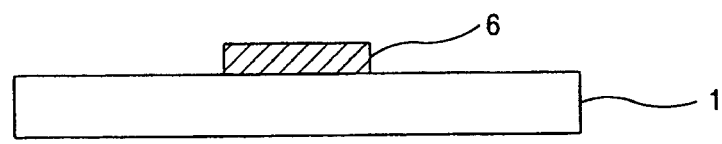
Figure 2A:
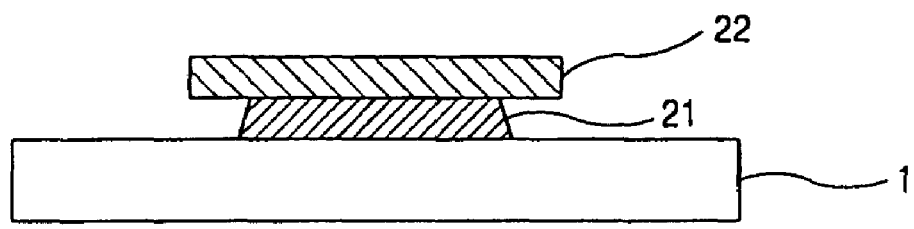
FIGS. 2A and 2B are sectional view showing an etched form of the gate line in accordance with the related art.
Figure 2B:
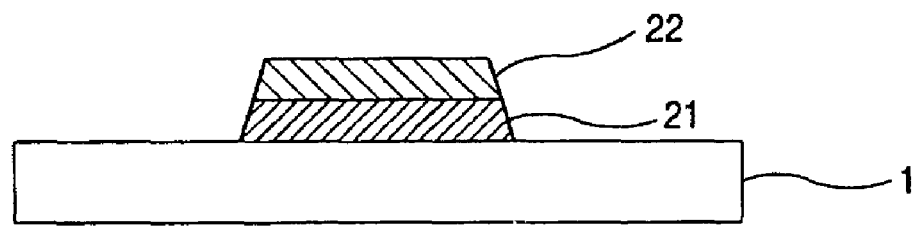
Figure 3:
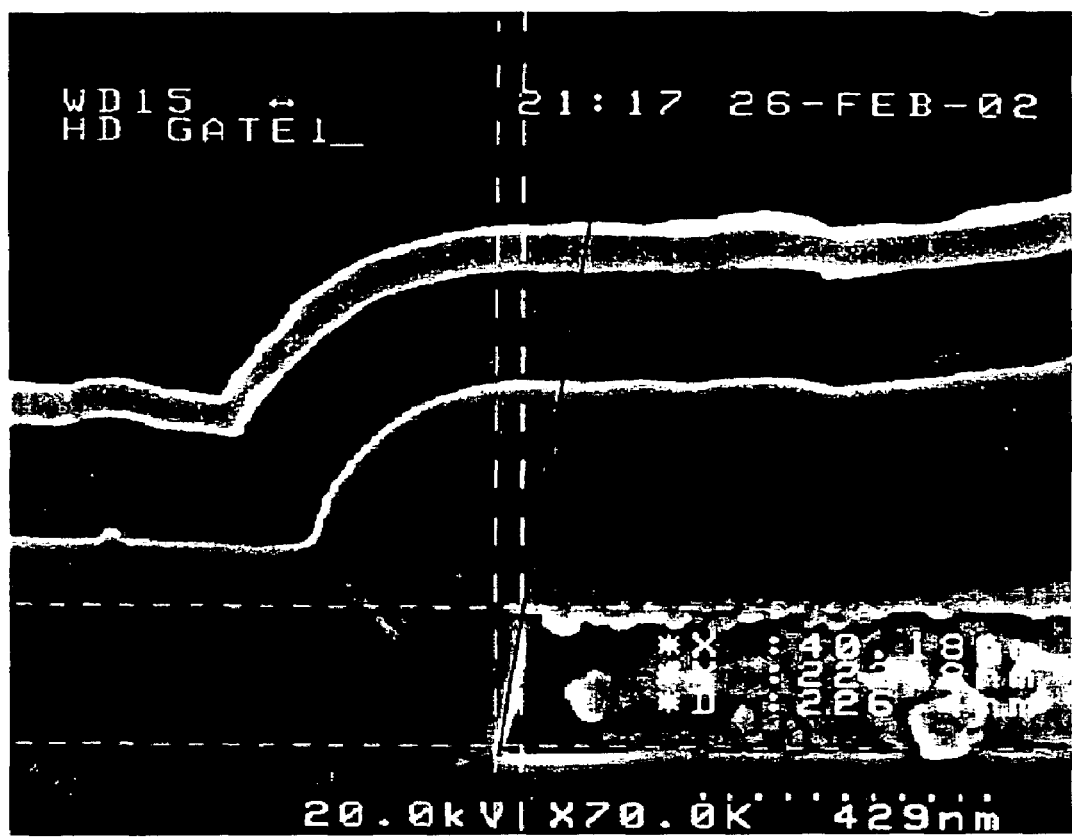
FIG. 3 is a photograph taken by an electron microscope showing a profile of the gate line formed using a gate metal etching etchant in accordance with the related art.

Reference will now be made in detail to the preferred embodiments of the present invention, examples of which are illustrated in the accompanying drawings.

An exemplary etchant according to the present invention used for etching a metal to form a gate includes nitric acid, a ferric compound, perchloric acid and a flouro compound, such as $HNO_3$, $Fe(NO_3)_3$, $HClO_4$ and $NH_4F$, and in this case, each weight ratio of $HNO_3$, $Fe(NO_3)_3$, $HClO_4$ and $NH_4F$ is about 7~12 wt %, 2~4 wt %, 1~4 wt % and 0.1~2.0 wt %, respectively. More specifically, 10 wt % $HNO_3$, 3 wt % $Fe(NO_3)_3$, 3 wt % $HClO_4$, 0.4 wt % $NH_4F$ and the remainder is water. Examples of other ferric compounds are $Fe(NO_3)_3$, $FeCl_3$, $Fe_2(SO4)_3$, $NH_4Fe(SO_4)_2$. Examples of other flouro compounds include $NH_4F$, $NH_4HF_2$, HF, NaF and KF.

In general, the ferric compound may be any compound that provides a $Fe^{3+}$ ions and the flouro compound may be any compound that provides $F^-$ ions. Further, acids other than perchloric acid can be used, such as $H_2SO_4$, HClO, $HClO_2$ and $HClO_3$. The process by which the components of the etchant react with a dual layer of an aluminum alloy layer and a molybdenum layer forming a gate line will now be described with reference to reaction formulas as follows.

The molybdenum layer of the gate metal reacts with nitric acid of the etchant component of the present invention according to:

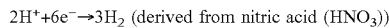

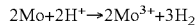

In the above reaction formula, the molybdenum layer is removed by oxidation and reduction with nitric acid. The aluminum alloy layer of the gate metal is removed by reacting with $Fe(NO_3)_3$ of the etchant.

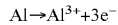

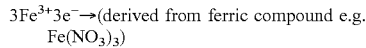

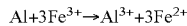

Through the above reaction formula, the aluminum layer is removed by oxidation and reduction with the ferric compound, which provides $Fe^{3+}$. $HClO_4$ of the etchant serves to make environment where an etching reaction can be actively made by lowering pH of the etchant, and a flouro compound to provide $F^-$ so as to prevent etched particles from being adsorbed into the surface of the metal while etching is performed and re-absorption of oxidized molybdenum ion. In particular, $HClO_4$ is stronger than hydrochloric acid, and more oxygen included in a chlorine based acid results in a stronger acidity of the chlorine based acid. Thus, HClO, $HClO_2$ or $HClO_3$ can be also used in place of $HClO_4$. Moreover, $H_2SO_4$ is a strong acid and can be used.

The gate line configured as the dual layer of the aluminum alloy layer and the molybdenum layer is removed by reacting with $HNO_3$ and $Fe(NO_3)_3$ among the etchant component. At this time, since the aluminum alloy layer and the molybdenum layer have the similar etching rates, the gate line can be etched in a perfect tapered shape by wet etching. In addition, when the gate line is formed by applying the etchant as described, a profile of the gate line is improved, and the profile of the tapered gate line has a gentle side tilt angle. The profile of the gate line prevents cutting in a depositing process of a thin layer formed on the gate line, and in this respect, the gentler the slope of the profile, the better.

Figure 4:
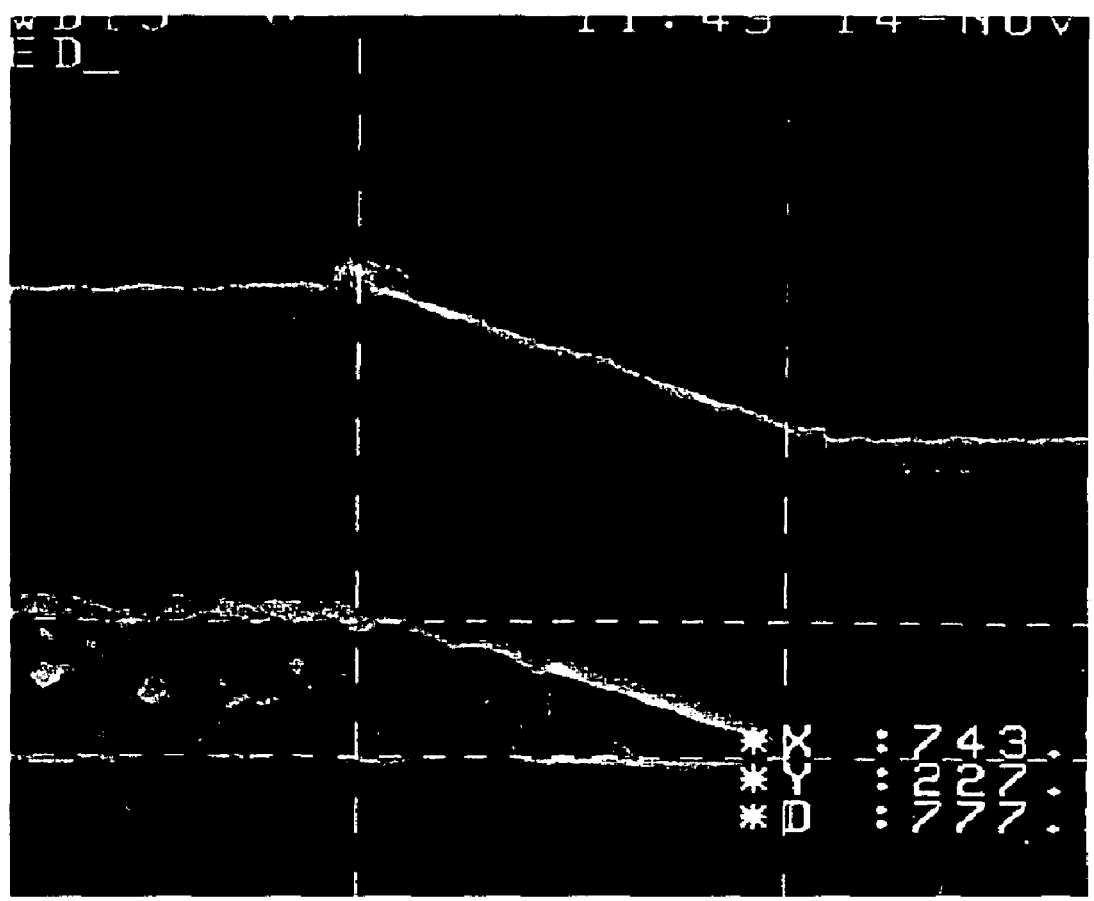
FIG. 4 is a photograph taken by an electron microscope showing a profile of a gate line formed by applying an etchant in accordance with an exemplary embodiment of the present invention.

FIG. 4 is a photograph taken by an electron microscope showing a gate line having an improved profile using an exemplary etchant in accordance with an exemplary embodiment the present invention. As shown in FIG. 4, the tilt angle of the side profile of the tapered gate line is about 45 degrees, showing an improvement compared to the gate line of the related art having a profile tilt angle of 70~80 degrees. In addition, as mentioned above, an amorphous ITO layer used as a pixel electrode can be etched by applying the etchant comprising $HNO_3$, $Fe(NO_3)_3$, $HClO_4$ and $NH_4F$. The amorphous ITO layer used as the pixel electrode is etched by the etchant, not generating crystalloid as a by-product of a reaction so that the crystal precipitate removing process as in the conventional art is not necessary. When the amorphous ITO layer is etched using the exemplary etchant of the present invention, a shorting bar portion formed to prevent static electricity during the step of forming the gate line can be also removed simultaneously.

The shorting bar portion is formed at an outer edge of the pixel region, and when the pixel electrode corresponding to a rear portion of a process of fabrication the TFT array is formed, the shorting bar portion is simultaneously removed. Here, the shorting bar portion is formed when the gate line is formed and is made of the same materials as the gate line. Thus, the shorting bar can be removed by the etchant used for formation of the gate line.

Figure 5:
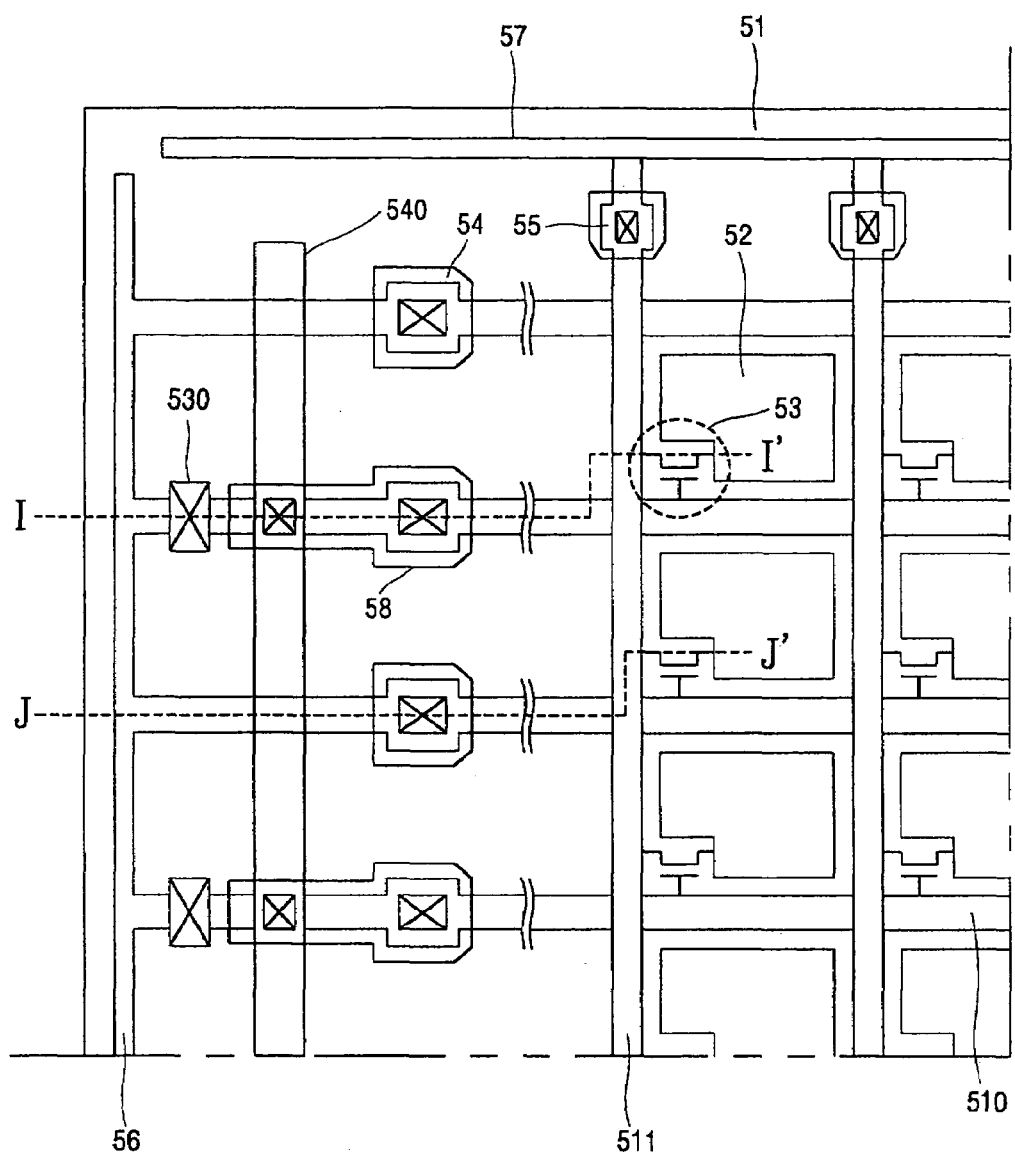
FIG. 5 is a plan view showing a TFT array substrate of a liquid crystal display device in accordance with an exemplary embodiment of the present invention.

The process of the TFT array substrate of the liquid crystal display device using the etchant will now be described. FIG. 5 is a plan view showing the TFT array substrate of the liquid crystal display device in accordance with an exemplary embodiment of the invention. As shown in FIG. 5, on the TFT array substrate 51, there are formed a plurality of gate lines 510 arranged in parallel and a plurality of data lines 511 intersecting the gate lines vertically. A plurality of pixel electrodes 52 are formed at the crossings of the gate lines 510 and the data lines 511. A TFT 53, as a switching device for controlling driving of the pixel electrode, is connected with the gate line 510 and the pixel electrode 52.

At an end of the gate line 510, namely, at an outer edge of a pixel region, gate pads 54 and 58 are formed corresponding to each gate line 510, and a data pad 55 connected to the data line 511 is connected to the end of the data line 511. The gate pads 54 and 58 are connected to the shorting bar portion by grouping odd lines and even lines. Namely, odd gate lines are connected to the first portion of shorting bar 56 and even gate lines are connected to the test line 540 formed in forming data lines. In order not to electrically connect the even gate lines and the first portion of shorting bar 56, passivation hole 530 is formed at each even gate lines.

To prevent static electricity that may be generated during the process of fabricating the TFT array substrate, the shorting bar 56 and 57 makes the gate lines and the data lines an equipotential structure by interconnecting them. The first portion of shorting bar 56 is formed simultaneously with the gate lines 510, and the second portion of shorting bar 57 connected to the data lines 511 is formed simultaneously with the data lines 511. The test line 540 is formed when the data lines 511 is formed, and connected to the even gate lines by a pads 58 made of the ITO (Indium Tin Oxide).

The process of fabricating the TFT array substrate having the above-described structure will now be described. FIGS. 6A through 6F show a sequential process of fabricating the TFT array substrate having a shorting bar along line I–I' of FIG. 5, and FIGS. 7A through 7C show a sequential process of fabricating the TFT array substrate having a shorting bar along line II–II' of FIG. 5.

Figure 6A:
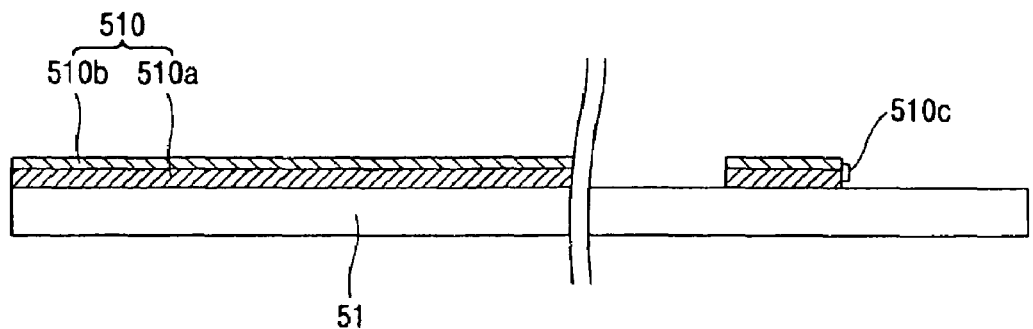
FIGS. 6A through 6F are cross-sectional views showing a sequential process of fabricating the TFT array substrate having a shorting bar along line I–I' of FIG. 5.

With reference to FIG. 6A, a substrate 51 having excellent light transmittance is prepared, on which a metal to form a gate is deposited by a sputtering method. As the metal, an alloy of aluminum and neodymium (Nd) is used. After the aluminum alloy layer 510a is deposited, the molybdenum metal layer 510b is successively deposited. The aluminum alloy layer 510a has excellent conductivity and, thus, is suitable as a gate line. However, since the aluminum alloy layer 510a does not have good ohmic contact characteristics with respect to the amorphous ITO layer which is connected to the pad part formed at the end of the gate line and applies a gate signal, the molybdenum layer 510b is additionally formed on the aluminum alloy layer 510a to enhance the ohmic contact characteristics.

Though not shown, after the gate metal 510 comprising the aluminum alloy layer 510a and the molybdenum layer 510b is deposited on the substrate, a photoresist layer is coated on the entire surface of the gate metal. Coating of the photoresist layer can be made through the general spin coating method, and any method can be adopted so long as it can coat the photoresist layer uniformly on the substrate. After the photoresist layer is coated, a gate line and a gate electrode 510c are formed by applying a mask and through a photolithography process. At this time, the first portion of shorting bar 56 is also formed. The gate line and the first portion of shorting bar are connected, as shown in FIG. 5.

The gate line and the gate electrode are formed through wet etching, and at this time, the etchant used for the wet etching includes $HNO_3$, $Fe(NO_3)_3$, $HClO_4$ and $NH_4F$. The molybdenum layer is removed by oxidation and reduction with nitric acid of the etchant, and the aluminum alloy layer is removed by oxidation and reduction with $Fe(NO_3)_3$. After the gate line, the gate electrode 510c and the first portion of shorting bar 56 are formed, the photoresist layer remaining on the metal is completely removed through a photoresist layer strip process. After the photoresist strip process, the resulting structure of the substrate is subject to a washing process to remove foreign material partially remaining thereon, and then, the following process is performed.

Figure 6B:
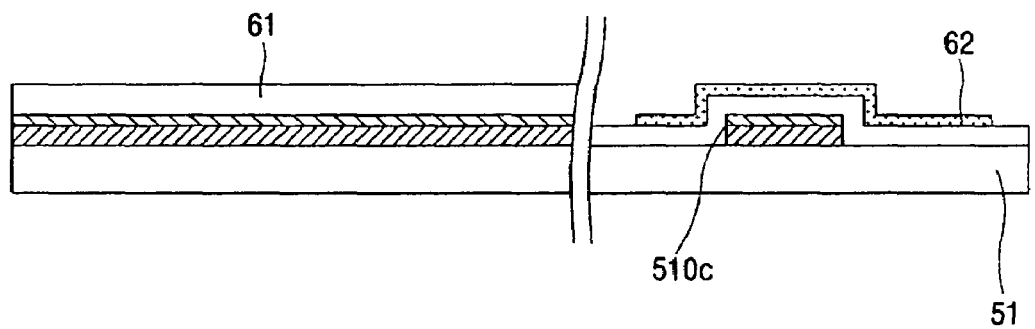

With reference to FIG. 6B, after the gate line and the gate electrode 510c are formed, a gate insulation layer 61 is formed on the substrate. The gate insulation layer 61 is formed to insulate the gate line and protect the gate line. The gate insulation layer 61 is typically formed as a silicon oxide layer ($SiO_2$) or as a silicon nitride layer ($SiN_x$) through a plasma enhanced chemical vapor deposition (PECVD). After forming the gate insulation layer 61, a semiconductor layer comprising an amorphous silicon layer and high density layer is formed on the gate insulation layer 61. The semiconductor layer is patterned to form an active layer 62 of the TFT.

Figure 6C:
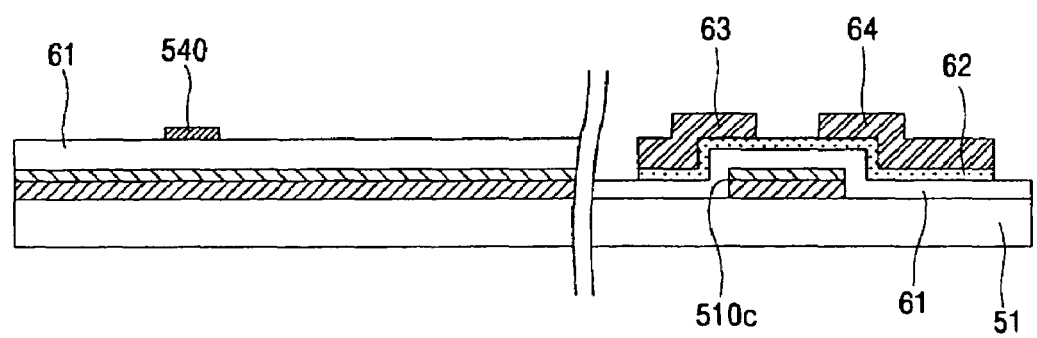

Next, as shown in FIG. 6C, a conductive layer for forming source and drain electrodes is formed on the gate insulation layer 61 and the active layer 62 by sputtering method. The conductive layer is patterned to form a test line 540 for testing even gate lines, data lines, and source and drain electrodes 63 and 64.

Figure 6D:
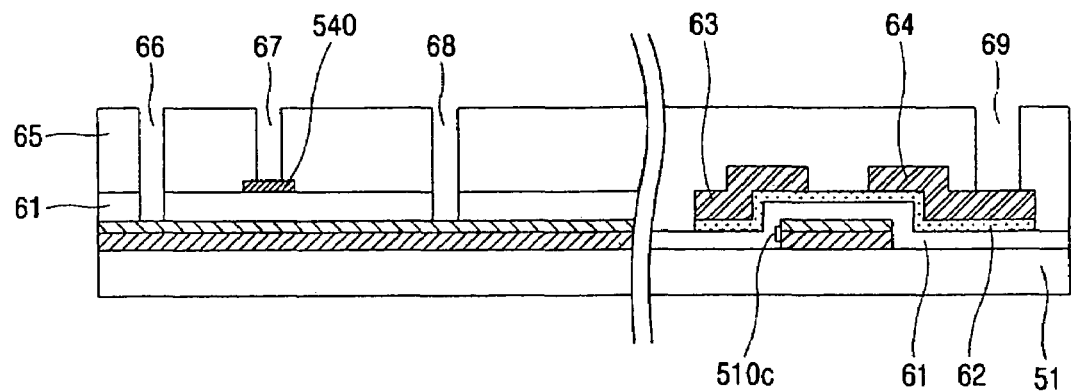

And then, as shown in FIG. 6D, a passivation layer 65 is formed to protect the elements. After formation of the passivation layer 65, a passivation hole 66 for insulating the shorting bar portion and even gate lines, a first contact hole 67 for connecting the test line and the ITO layer, a second contact hole 68 for connecting the test line 540 and even gate lines, and a third contact hole 69 for connecting the pixel electrode and the drain electrode 64. The passivation hole 66 is formed for separately performing a testing process by discriminating even gate lines and odd gate lines.

After the TFT array substrate is completed, a final testing is performed to check whether there is a line deficiency due to a disconnection and short generated in the gate lines. Since the line deficiency is generated as adjacent gate lines contact with each other, it can be effectively detected by separately testing the even gate lines and odd gate lines. Subsequently, a pixel electrode material is formed on the passivation layer 65 with the contact holes 66, 67, 68 and 69 formed therein, and patterned to form a pixel electrode and a gate pad.

Figure 6E:
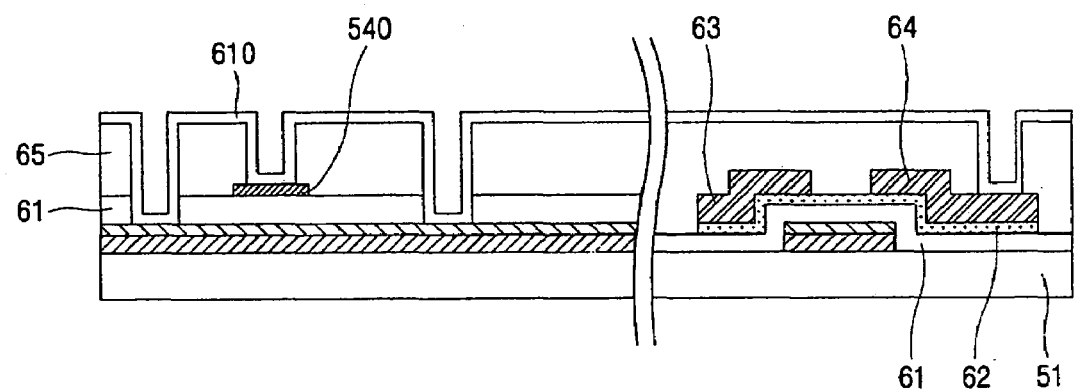

In this case, as shown in FIG. 6E, the pixel electrode material is filled in the passivation hole 66 and connected to the gate lines at the lower side. The patterning of the pixel electrode material can be effectively etched by applying the etchant, which is the same etchant being used for patterning the gate metal. By this etching process, the pixel electrode 52 and the gate pad 58 are formed while the pixel electrode material in the passivation hole 66 and the gate line at its lower side are removed such that the even gate lines and the first portion of shorting bar are separated. In the process of patterning the pixel electrode material, the test line 540 is connected to the pixel electrode material through the first contact hole 67 and the second contact hole 68.

Figure 6F:
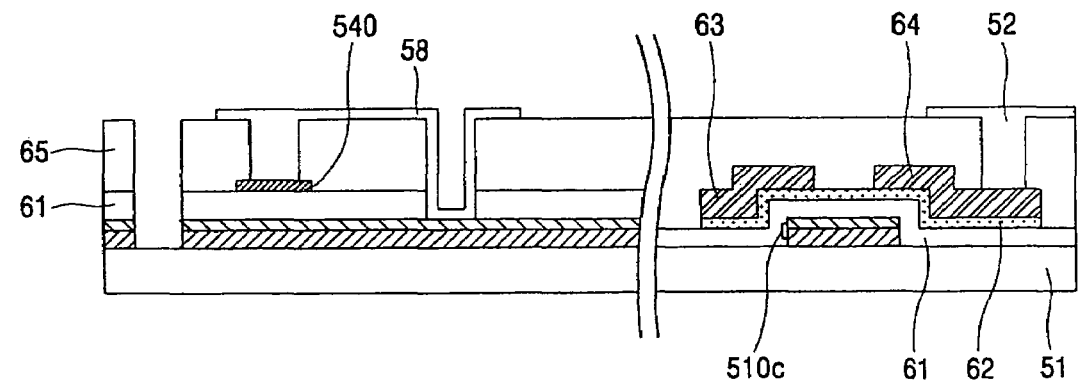

FIG. 6F shows the passivation hole 66 without the pixel electrode material and the gate line materials, the gate pad 58 connecting the test line 540 and the gate line, and a pixel electrode connected to the TFT. In particular, the process of etching the pixel electrode uses the etchant including $HNO_3$, $Fe(NO_3)_3$, $HClO_4$ and $NH_4F$. The exemplary etchant of the present invention can etch not only the amorphous ITO layer but also the gate line formed as a dual layer of the aluminum alloy layer and the molybdenum layer.

When the related art etchant is used, the step of etching the amorphous ITO layer and the step of etching the gate line shorting bar portion are performed separately, making the process complicated. But comparatively, in accordance with the present invention, when the ITO layer is etched by using the etchant, the pixel electrode forming ITO layer and a portion of the gate line are etched through a one-time wet etching to separate the even gate lines and the odd gate lines.

Figure 7A:
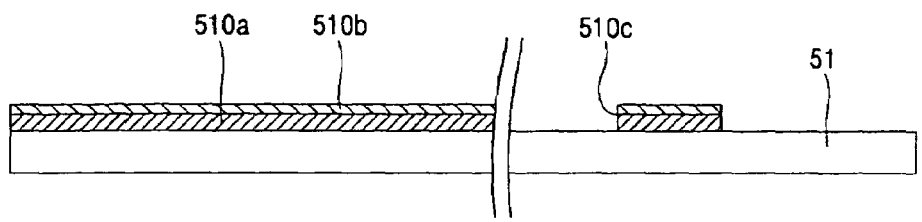
FIGS. 7A through 7C are cross-sectional views showing a sequential process of fabricating the TFT array substrate having a shorting bar along line II–II' of FIG. 5.
Figure 7B:
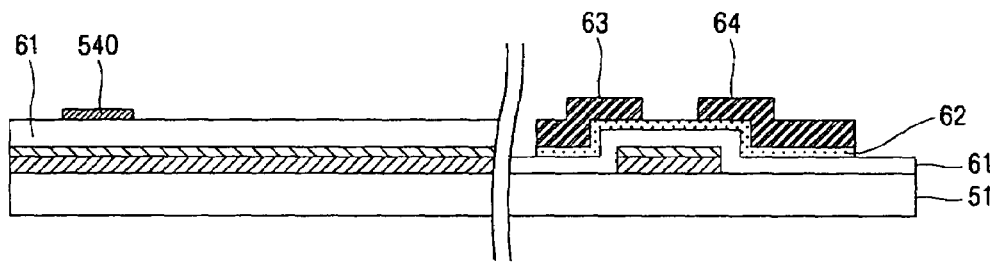
Figure 7C:
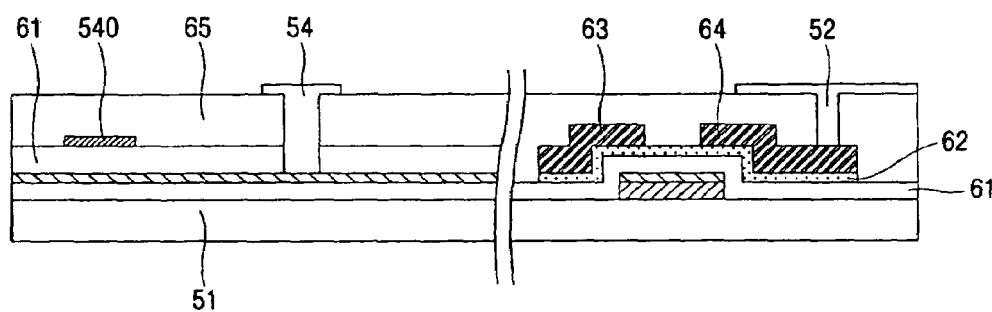

FIGS. 7A through 7C show a sequential process of fabricating the TFT array substrate having a shorting bar along line II—II of FIG. 5. As shown in FIG. 7A, a gate electrode 510c and a gate line comprising an aluminum metal 510a and molybdenum 510b are formed on a transparent substrate 51. At this time, a first portion of shorting bar 56 is also formed.

After the gate line and gate electrode 510c are completed, as shown in FIG. 7B, a gate insulation layer 61 is formed. Subsequently, an active layer 62, source/drain electrodes 63 and 64 and a test line 540 of the TFT are formed. When the test line 540 is formed, data lines are also formed together.

After forming the source/drain electrodes 63 and 64, a passivation layer 65 is formed on the substrate. And then, a first contact hole for forming a gate line pad and a second contact hole for connecting the drain electrode 64 and a pixel electrode are formed, and a pixel electrode material is coated. The pixel electrode material is patterned to form a gate pad portion 54 in the first contact hole and a pixel electrode 52 connected to the drain electrode 64 is formed.

The odd gate lines are respectively connected to the first portion of shorting bar, so the entire odd gate lines form one equipotential surface. The first portion of shorting bar also serves as a test line for checking line deficiency of odd gate lines in a final testing process. After the TFT array substrate is completed, the gate pad and the shorting bar are cut out to be removed using a scribe wheel, thereby forming the TFT array substrate. As a result, the gate line has a gate pad at its end, and as the gate pad is connected to a driving circuit, the TFT array substrate is operated.

As described, by fabricating the liquid crystal display device by applying the etchant in accordance with the present invention, in the process of forming the gate line formed as a dual layer comprising the aluminum alloy layer and the molybdenum layer, the gate line having a good profile tilt angle can be formed by a single wet etching process, and in the process of forming the pixel electrode, the pixel electrode is etched and a portion of the gate line is removed by applying the etchant. Thus, the shorting bar and the even gate lines can be separated, reducing the process. In addition, in the step of removing the pixel electrode formed as an amorphous ITO layer, since no crystal precipitate is generated, the equipment can be easily operated, the maintenance cost can be reduced, and the process complexity can be reduced.

It will be apparent to those skilled in the art that various modifications and variations can be made in the method for fabricating liquid crystal display device of the present invention without departing from the spirit or scope of the invention. Thus, it is intended that the present invention cover the modifications and variations of this invention provided they come within the scope of the appended claims and their equivalents.

What is claimed is:

1. A method for fabricating a TFT array substrate for a liquid crystal display device, comprising:
    preparing a substrate;
    forming a gate line on the substrate using a first etchant;
    forming an insulation layer on the gate line;
    forming a semiconductor layer on a portion of the insulation layer;
    forming a test line on the insulation layer and source and drain electrodes on the semiconductor layer;
    forming a passivation layer having passivation hole to expose a portion of the gate line on the substrate; and
    forming a pixel electrode on the passivation layer by applying a second etchant including $HNO_3$, a ferric compound, $HClO_4$ and flouro compound.

2. The method of claim 1, wherein the first etchant and the second etchant have the same composition.

3. The method of claim 1, wherein forming the gate line includes forming an aluminum alloy layer, and forming a molybdenum layer on the aluminum alloy layer.

4. The method of claim 3, wherein forming the gate line further includes forming a first portion of a shorting bar.

5. The method of claim 4, wherein forming the pixel electrode includes:
    forming a pixel electrode material on the passivation layer;
    removing the pixel electrode material in the passivation hole; and
    removing the gate line at the lower portion of the passivation hole, thereby separating the shorting bar and at least a portion of the gate line.

6. The method of claim 5, wherein the pixel electrode material in the passivation hole and the gate line are removed using the second etchant.

7. The method of claim 1, wherein forming the passivation hole further includes forming a first contact hole for exposing the test line, a second contact hole for forming a gate pad, and a third contact hole for connecting the drain electrode and the pixel electrode.

8. The method of claim 7, wherein the passivation hole, the first contact hole, the second contact hole, and the third contact hole are simultaneously formed.

9. The method of claim 1, wherein forming the pixel electrode includes forming a gate pad.

10. The method of claim 1, wherein the exposed portion of the gate line includes a portion of the even gate line.

11. The method of claim 1, wherein the pixel electrode includes an amorphous ITO (Indium Tin Oxide).

12. The method of claim 1, wherein forming the gate line includes wet etching.

13. The method of claim 1, wherein forming the gate line using the first etchant that includes $HNO_3$, a ferric compound, $HClO_4$ and flouro compound.

14. The method of claim 1, wherein the ferric compound is one of $Fe(NO_3)_3$, $FeCl_3$, $Fe_2(SO4)_3$, $NH_4Fe(SO_4)_2$.

15. The method of claim 1, wherein the flouro compound is one of $NH_4F$, $NH_4HF_2$, $HF$, $NaF$ and $KF$.

16. The method of claim 1, wherein the first etchant includes 7~12 wt % $HNO_3$, 2~4 wt % $Fe(NO_3)_3$, 1~4 wt % $HClO_4$, 0.1~2.0 wt % $NH_4F$.

17. The method of claim 16, wherein the first etchant is 10 wt % $HNO_3$, 3 wt % $Fe(NO_3)_3$, 3 wt % $HClO_4$, 0.4 wt % $NH_4F$ and water.

18. A method for fabricating a TFT array substrate for a liquid crystal display device, comprising:
    preparing a substrate;
    forming a gate line and a shorting bar on the substrate;
    forming an insulation layer on the gate line;
    forming a semiconductor layer on a portion of the insulation layer;
    forming a test line on the insulation layer and source and drain electrodes on the semiconductor layer;
    forming a passivation layer having passivation hole to expose a portion of the gate line on the substrate; and
    patterning a pixel electrode on the passivation layer and removing the gate line at the lower portion of the passivation hole, thereby separating the shorting bar and at least a portion of the gate line by applying an etchant including $HNO_3$, a ferric compound, $HClO_4$ and flouro compound.

19. The method of claim 18, wherein forming the gate line using the first etchant that includes $HNO_3$, a ferric compound, $HClO_4$ and flouro compound.

20. The method of claim 18, wherein the ferric compound is one of $Fe(NO_3)_3$, $FeCl_3$, $Fe_2(SO4)_3$, $NH_4Fe(SO_4)_2$.

21. The method of claim 18, wherein the flouro compound is one of $NH_4F$, $NH_4HF_2$, $HF$, $NaF$ and $KF$.

22. The method of claim 18, wherein the etchant includes 7~12 wt % $HNO_3$, 2~4 wt % $Fe(NO_3)_3$, 1~4 wt % $HClO_4$, 0.1~2.0 wt % $NH_4F$.

23. The method of claim 22, wherein the etchant is 10 wt % $HNO_3$, 3 wt % $Fe(NO_3)_3$, 3 wt % $HClO_4$, 0.4 wt % $NH_4F$ and water.

* * * * *